(12) United States Patent
Matsumoto (10) Patent No.: US 6,177,701 B1
(45) Date of Patent: *Jan. 23, 2001

(54) SEMICONDUCTOR DEVICE WITH RESISTOR AND FABRICATION METHOD THEROF

(75) Inventor: Naoya Matsumoto, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/774,720

(22) Filed: Jan. 3, 1997

(30) Foreign Application Priority Data

Jan. 4, 1996 (JP) .................................. 8-000090

(51) Int. Cl.[7] ................................................ H01L 27/108
(52) U.S. Cl. ...................... 257/310; 257/751; 257/768; 257/689; 257/387
(58) Field of Search ..................... 257/751, 768, 257/748, 689, 774, 754, 387, 388, 382, 310

(56) References Cited

U.S. PATENT DOCUMENTS

| | | | |
|---|---|---|---|
| 4,675,715 | * 6/1987 | Lepselter | 257/51 |
| 5,304,838 | * 4/1994 | Ozawa | 257/436 |
| 5,464,795 | * 11/1995 | Oguro | 438/482 |
| 5,506,166 | * 4/1996 | Sandhu et al. | 437/60 |
| 5,530,279 | * 6/1996 | Yamamichi et al. | 257/310 |
| 5,627,391 | * 5/1997 | Shimada et al. | 257/751 |
| 5,668,396 | * 9/1997 | Sato | 257/588 |
| 5,717,236 | * 2/1998 | Shinkawata | 257/310 |

FOREIGN PATENT DOCUMENTS

| | | |
|---|---|---|
| 2-15620 | 1/1990 | (JP) . |
| 3-22562 | 1/1991 | (JP) . |
| 4-209526 | 7/1992 | (JP) . |

* cited by examiner

Primary Examiner—Leo P. Picard
Assistant Examiner—Hung Van Duong
(74) Attorney, Agent, or Firm—Foley & Lardner

(57) ABSTRACT

A semiconductor device capable of the area reduction of a resistor. A semiconductor substrate having a first conductive region is prepared. A dielectric layer is formed to cover the first conductive region. The dielectric layer has a contact hole formed to vertically penetrate the dielectric layer. The first conductive region is exposed from the dielectric layer in the contact hole. A semiconductor plug is formed to fill the contact hole with a material of the plug. The plug is doped with an impurity. The bottom of the plug is contacted with the first conductive region. A second conductive region is selectively formed to cover the semiconductor plug. The second conductive region is contacted with the top of the semiconductor plug. The semiconductor plug has a resistance. The semiconductor plug and the second conductive region has a contact resistance. The semiconductor plug and the second conductive region serve as a resistor having a resistance equal to the sum of the resistance of the semiconductor plug and the contact resistance. Preferably, the resistance of the second conductive region is equal to or less than ($1/10$) of the contact resistance of the semiconductor plug and the second conductive layer.

6 Claims, 8 Drawing Sheets

SEMICONDUCTOR DEVICE WITH RESISTOR AND FABRICATION METHOD THEROF

BACKGROUND OF THE INVENTION

1. Field of the Invention

The present invention relates to a semiconductor device and more particularly, to a semiconductor device including a resistor and an active component such as a bipolar transistor and a Field-Effect Transistors (FET), and a fabrication method of the device.

2. Description of the Prior Art

With the fabrication of a semiconductor device termed a "gate array", a semiconductor substrate including active and passive components therein is prepared in advance. The components are arranged in the form of an array. Then, customized interconnection layers are formed on or over the active and/or passive components to electrically interconnect the related components. Thus, an integrated circuit device having specific functions is fabricated according to the need of a customer.

Figure 1:
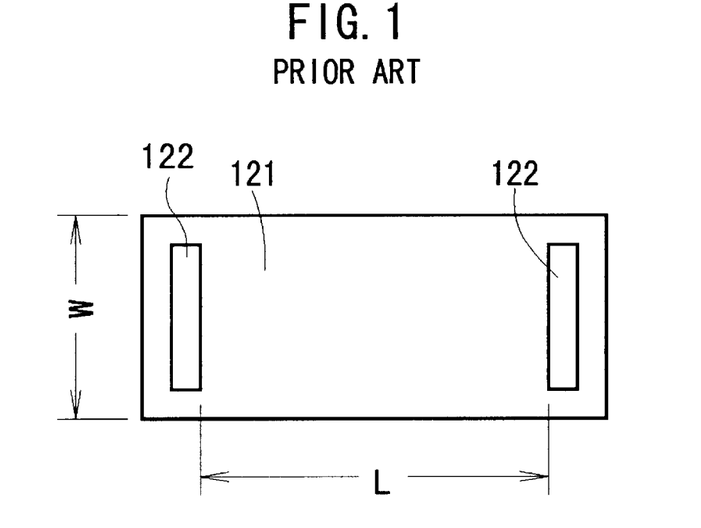
FIG. 1 is a plan view showing a resistor used for a conventional semiconductor device.

FIG. 1 shows a schematic plan view of a resistor used for the semiconductor device of this sort.

In FIG. 1, the resistor is made of a patterned polysilicon layer 121 with a rectangular plan shape. The layer 121 is doped with an n- or p-type impurity to realize a wanted conductivity. Two contact areas 122 are formed on the layer 121 near its opposite ends, respectively. The width of the layer 121 is W, and the distance between the contact areas 122 is L.

When the sheet resistance of the doped polysilicon layer 121 is defined as $\rho_s$, and the contact resistance of the layer 121 at the contact areas 122 is defined as $R_c$, the resistance R of the polysilicon resistor is expressed as the following equation (1).

$$R = \rho_s(L/W) + 2R_c \qquad (1)$$

Figure 2:
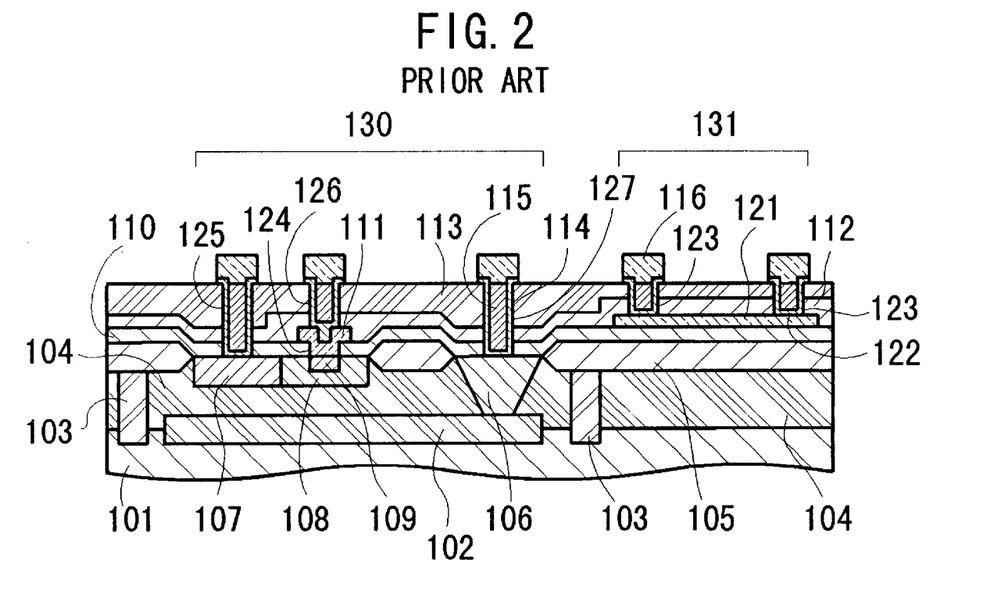
FIG. 2 is a cross-sectional view showing a conventional semiconductor device having a bipolar transistor and a resistor.

A conventional semiconductor device including the polysilicon resistor of FIG. 1 is shown in FIG. 2, which is, for example, disclosed in the Japanese Non-Examined patent Publication No. 3-22562 published in January 1991. Although this semiconductor device has a plurality of bipolar transistor regions and a plurality of resistor regions, only one bipolar transistor region and only one resistor region are explained here for the sake of simplification.

As shown in FIG. 2, this semiconductor device includes a bipolar transistor region 130 having an npn-type bipolar transistor and a resistor region 131 having a resistor.

An n-type single-crystal silicon (Si) epitaxial layer 104 is formed on the surface of a p-type single-crystal silicon substrate 101. An n-type buried layer 102 is formed near the interface of the substrate 101 and the epitaxial layer 104. A p-type insulating layer 103 is selectively formed in the epitaxial layer 104. The bottom of the layer 103 is extended to the inside of the substrate 101.

A field oxide layer 105 of silicon dioxide ($SiO_2$) is selectively formed in the surface are of the epitaxial layer 104 for electrical isolation. The bipolar transistor region 130 is electrically isolated from the resistor region 131 and other device regions (not shown) adjacent to the region 130.

In the transistor region 130, an $n^+$-type collector connection region 106, a p-type extrinsic base region 107, and a p-type intrinsic base region 108, an n-type emitter region 109 are formed in the epitaxial layer 104.

A $SiO_2$ layer 110 is formed on the field oxide layer 105 and the exposed epitaxial layer 104. A contact window 124 is formed in the $SiO_2$ layer 110 to expose the underlying emitter region 109.

An n-type polysilicon emitter contact region 111 is selectively formed on the $SiO_2$ layer 110 to be contacted with the emitter region 109 through the window 124 in the transistor region 130. The emitter contact region 111 is doped with arsenic (As). The As-doped region 111 serves as a diffusion source of the n-type impurity As during the thermal diffusion process of forming the n-type emitter region 109.

An n-type polysilicon resistor layer 121 is selectively formed on the $SiO_2$ layer 110 in the resistor region 131. The resistor layer 121 also is doped with As, and serves as the resistor as shown in FIG. 1. The doping concentration of As in the layer 121 is set at a value that enables a wanted resistance.

A $SiO_2$ layer 112 and a Boro-Phospho-Silicate Glass (BPSG) layer 113 are successively formed on the $SiO_2$ layer 110 to cover the n-type polysilicon emitter contact 111 and the n-type polysilicon resistor layer 121.

A contact hole 125 is formed to vertically penetrate the BPSG layer 113, the $SiO_2$ layer 112, and the $SiO_2$ layer 110 in the transistor region 130. The contact hole 125 is located above the extrinsic base region 107 and exposes the underlying region 107.

A contact hole 126 is formed to vertically penetrate the BPSG layer 113 and the $SiO_2$ layer 112 in the transistor region 130. The contact hole 126 is located above the emitter contact region 111 and exposes the underlying region 111.

Two contact holes 123 are formed to vertically penetrate the BPSG layer 113 and the $SiO_2$ layer 112 in the resistor region 131. The contact hole 123 are located above the resistor layer 121 and exposes the underlying layer 121.

Barrier metal layers 114 are selectively formed in the contact holes 123, 125, 126 to cover the sides and bottoms of the holes 123, 125, 126, respectively. The layer 114 in the hole 125 is contacted with the extrinsic base region 107. The layer 114 in the hole 126 is contacted with the emitter contact region 111. The two layers 114 in the hole 123 are contacted with the polysilicon resistor layer 121, respectively.

Tungsten (W) layers 115 are selectively formed on the corresponding barrier metal layers 114 in the contact holes 123, 125, 126, respectively. The W layers 115 bury the corresponding holes 123, 125, and 126. In other words, the W layers 115 serve as conductor plugs, respectively.

Wiring or interconnection layers 116 made of an alloy of AlSiCu are selectively formed on the corresponding barrier layers 114 and the corresponding W layers 115, respectively.

Figure 3A:
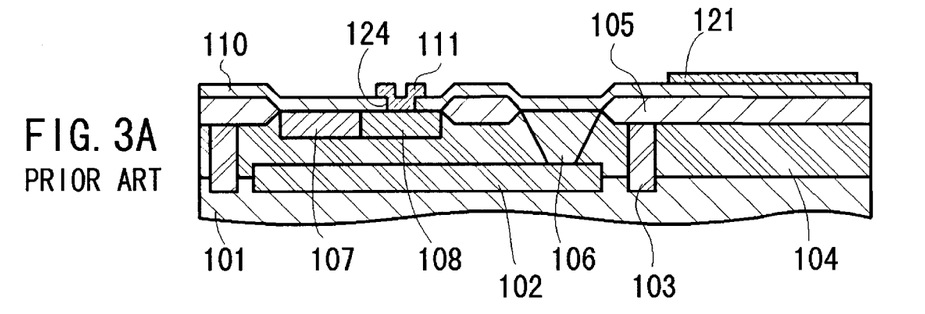
FIGS. 3A and 3B are cross-sectional views showing the fabrication process sequence of the conventional semiconductor device of FIG. 2, respectively.

The conventional semiconductor device of FIG. 2 is fabricated in the following way:

First, as shown in FIG. 3A, the n-type single-crystal Si epitaxial layer 104, the n-type buried layer 102, the p-type insulating layer 103, the field oxide layer 105 of $SiO_2$, the $n^+$-type collector connection region 106, the p-type extrinsic base region 107, and the p-type intrinsic base region 108, and the n-type emitter region 109 are formed on the p-type single-crystal Si substrate 101 with the use of known process steps.

Then, the $SiO_2$ layer 110 with a thickness of 150 to 400 nm is formed on the field oxide layer 105 and the exposed epitaxial layer 104 by using, for example, a Chemical Vapor Deposition (CVD) process.

The contact window 124 is formed in the $SiO_2$ layer 110 by using photolithography and dry etching processes, thereby exposing the underlying the intrinsic base region 108.

Subsequently, a polysilicon layer (not shown) with a thickness of approximately 330 nm is formed on the $SiO_2$ layer 110 by using, for example, a Low-Pressure CVD process. This polysilicon layer may be formed by a sputtering process. In this case, this layer becomes amorphous. This means that the polysilicon layer may be replaced with an amorphous silicon layer.

A part of the polysilicon layer thus formed, which serves as the impurity source for the formation process of the n-type emitter region 109, is selectively doped with As by an ion-implantation process at an acceleration energy of 50 keV to 100 keV with a dose of $1 \times 10^{16}$ atoms/cm$^2$. Further, while masking the As doped part of the polysilicon layer, the remaining part of the polysilicon layer is selectively doped with boron (B) by an ion-implantation process at an acceleration energy of 30 keV with a dose of $6 \times 10^{14}$ atoms/cm$^2$. The acceleration energy and the dose of the second ion-implantation process are determined to realize a wanted, predetermined sheet resistance and a wanted, predetermined contact resistance in the resistor region 130.

The polysilicon layer thus ion-implanted twice is then patterned by photolithography and dry etching processes; thereby forming the n-type polysilicon emitter contact region 111 and the p-type polysilicon resistor region 121. The state at this stage is shown in FIG. 3A.

The n-type polysilicon emitter contact region 111 is contacted with the intrinsic base region 108 through the window 124 in the transistor region 130. The p-type polysilicon layer 121 is contacted with the SiO$_2$ layer 110 in the resistor region 131.

Following this patterning process, the SiO$_2$ layer 112 with a thickness of approximately 200 nm and the BPSG layer 113 with a thickness of approximately 1000 nm are successively formed on the SiO$_2$ layer 110 to cover the n-type polysilicon region 111 and the p-type polysilicon region 121.

Figure 3B:
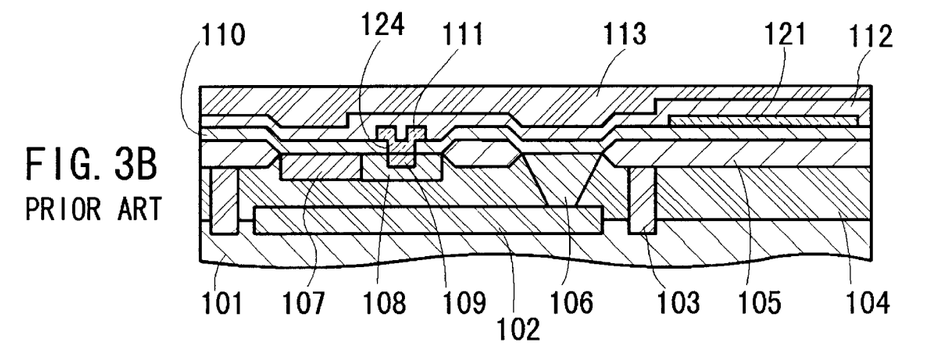

The device assembly thus prepared is subjected to a heat treatment at a temperature of 950° C. for approximately 20 minutes. Through this heat-treatment process, the implanted As atoms in the emitter contact region 111 are thermally diffused into the intrinsic base region 108, resulting in the n-type emitter region 109 therein. At the same time as this diffusion process, the BPSG layer 113 is reflown, resulting in the planarized surface of the layer 113. The state at this stage is shown in FIG. 3B.

Further, the BPSG layer 113 thus reflown and the underlying SiO$_2$ layers 112 and 110 are patterned by photolithography and dry etching processes, thereby forming the contact hole 125.

Through the similar ways, the contact hole 126 is formed in the BPSG layer 113 and the SiO$_2$ layer 112 in the transistor region 130, and the contact holes 123 are formed in the BPSG layer 113 and the SiO$_2$ layer 112 in the resistor region 131.

A metal layer (not shown) serving as the barrier metal layers 114 is deposited by a CVD process. This metal layer has a two-layer structure made of a lower titanium (Ti) sublayer with a thickness of 5 nm and an upper titanium nitride (TiN) sublayer with a thickness of 100 nm.

A W layer (not shown) with a thickness of 1000 nm is deposited on the metal layer by a CVD process. Then, the metal layer and the W layer are etched back to selectively remove these layers, thereby leading the barrier metal layers 114 in the contact holes 123, 125, 126, and the W layers 115 on the corresponding barrier metal layers 114, respectively.

An AlSiCu layer (not shown) with a thickness of 800 nm is deposited by a CVD process and then, is patterned by photolithography and dry etching processes. Thus, the wiring AlSiCu layers 116 are selectively formed on the corresponding W layers 115, respectively.

Finally, the semiconductor assembly thus obtained is subjected to a heat treatment for an annealing purpose at a temperature of 430° C. for approximately 30 minutes. Thus, the conventional semiconductor shown in FIG. 2 is finished.

Figure 4:
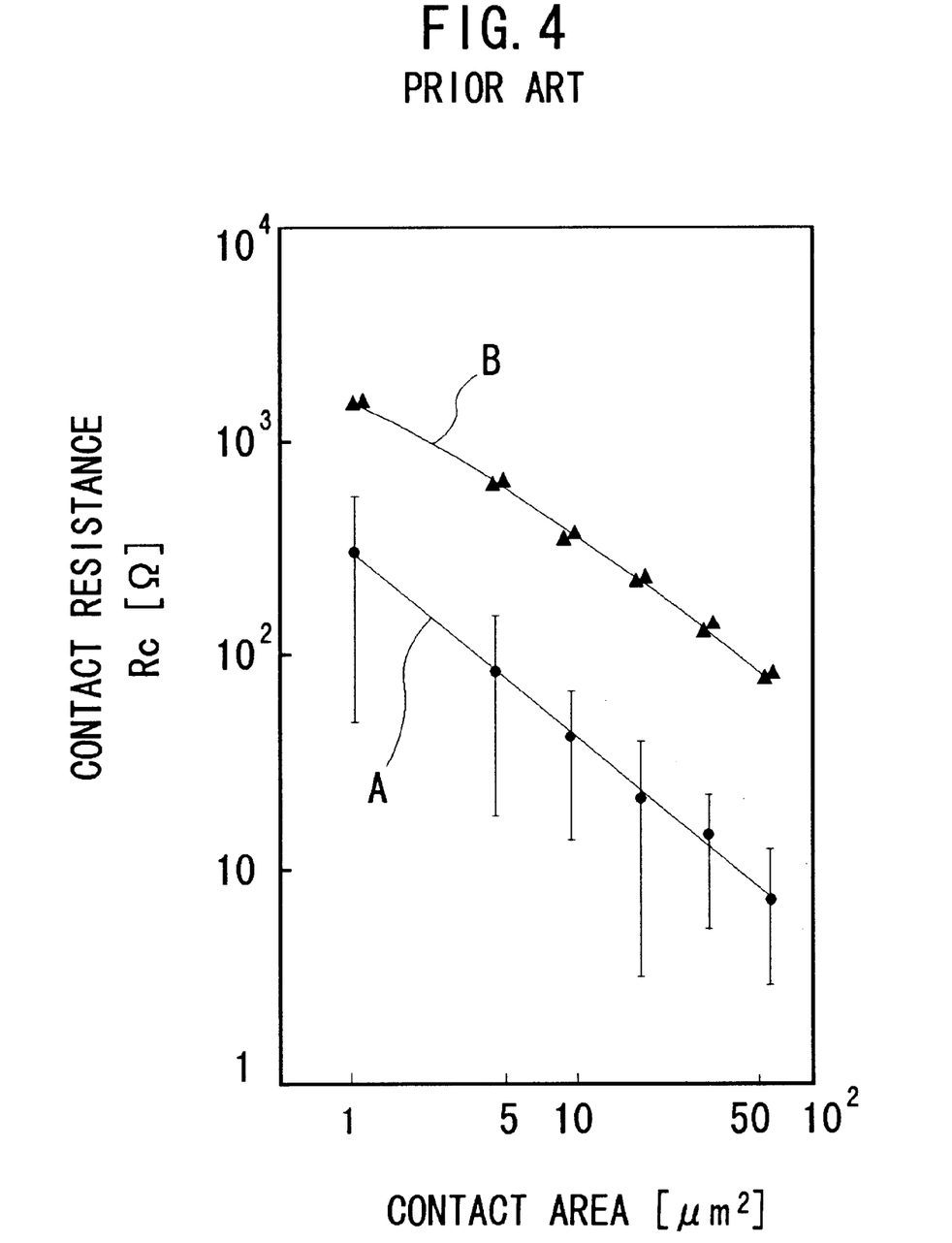
FIG. 4 is a graph showing the relationship of the contact resistance with the contact area in the conventional semiconductor device of FIG. 2, in which the line A is for the case without the metal barrier layer and the line B is for the case with the metal barrier layer.

With the conventional semiconductor device shown in FIG. 2, to reduce the area of the resistor region 131, contact resistance between the polysilicon layer 112 and the metal barrier layer 123 is used. This point is explained in detail below with reference to FIG. 4 showing the contact area dependence of the contact resistance.

The arsenic-doped polysilicon layer 121 formed by the above-described processes has a sheet resistance of approximately 700 Ω/sq. It is seen from the line B in FIG. 4 that the contact resistance $R_c$ between the polysilicon layer 121 and the metal barrier metal 114 is approximately 700 Ω/sq at the contact area of 4 $\mu$m$^2$ (=2 $\mu$m×2 $\mu$m), which is very high. Also, the contact resistance $R_c$ has a small fluctuation.

As a result, if a resistor whose resistance R is 3.5 kΩ is formed by the polysilicon layer 121 with the contact area of 4 $\mu$m$^2$ (=2 $\mu$m×2 $\mu$m), the length L of the resistor is expressed as the following equation (2).

$$L=(3500-700\times2)\times4\times(1/700)=12 \ \mu m \quad (2)$$

On the other hand, if the metal barrier layer 114 is not used, it is seen from the line A in FIG. 4 that the contact resistance $R_c$ between the polysilicon layer 121 and the W layer 115 is approximately 70 Ω/sq at the contact area of 4 $\mu$m$^2$ (=2 $\mu$m×2 $\mu$m), which is very low. Therefore, the length L of the resistor is expressed as the following equation (3).

$$L=(3500-70\times2)\times4\times(1/700)=19.2 \ \mu m \quad (3)$$

As seen from the equations (2) and (3), with the conventional semiconductor device shown in FIG. 2, the necessary area of the resistor can be reduced compared with the case of no barrier metal layer by approximately 40%.

However, the improvement by the above conventional semiconductor device in FIG. 2 is insufficient for the gate arrays, the reason of which is as follows.

For general-purpose semiconductor devices such as memories and microprocessors, the chip area is able to be reduced by carefully designing the layout of the devices and/or their interconnections if the improvement of the conventional semiconductor device in FIG. 2 is applied.

On the other hand, for the gate arrays, a plurality of passive components such as resistors and a plurality of active components such as transistors are prepared in advance on the semiconductor substrate, and than, the interconnection layers are formed on the active and passive components to realize the circuit functions required by a customer. Therefore, part of the prepared resistors may not be practically used according to the required circuit configuration. This causes the necessary chip area to be increased.

SUMMARY OF THE INVENTION

Accordingly, an object of the present invention is to provide a semiconductor device and a fabrication method thereof that is able to reduce the area of a resistor.

Another object of the present invention is to provide a semiconductor device and a fabrication method thereof that is capable of chip area reduction even for the gate arrays.

Still another object of the present invention is to provide a semiconductor device and a fabrication method thereof that makes it possible to realize the fabrication yield increase.

According to a first aspect of the present invention, a semiconductor device is provided, which includes the following configuration:

A semiconductor substrate having a first conductive region is prepared. A dielectric layer is formed to cover the first conductive region. The dielectric layer has a contact hole formed to vertically penetrate the dielectric layer. The first conductive region is exposed from the dielectric layer in the contact hole.

A semiconductor plug is formed to fill the contact hole with a material of the plug. The plug is doped with an impurity. The bottom of the plug is contacted with the first conductive region.

A second conductive region is selectively formed to cover the semiconductor plug. The second conductive region is contacted with the top of the semiconductor plug.

The semiconductor plug has a resistance. The interface of the semiconductor plug and the second conductive region has a contact resistance. The semiconductor plug and the second conductive region serve as a resistor having a resistance equal to the sum of the resistance of the semiconductor plug and the contact resistance.

With the semiconductor device according to the first aspect of the invention, the contact hole of the dielectric layer, which vertically penetrates the dielectric layer, is filled with the impurity-doped semiconductor plug. Also, the bottom of the plug is contacted with the first conductive region and the top of the plug is contacted with the second conductive region. Therefore, the first and second conductive regions are electrically connected to each other through the semiconductor plug.

Further, the semiconductor plug and the second conductive region serve as the resistor having the resistance equal to the sum of the resistance of the semiconductor plug and the contact resistance.

Accordingly, the first and second conductive regions are overlapped with each other and as a result, the area of the resistor is substantially defined by the plan size of the plug. This means that the area of the resistor can be reduced.

Also, since the first and second conductive regions are overlapped with each other, a terminal region of an active element is used as the first conductive region, the semiconductor plug can be laid right over the active element. This means that no space dedicated to a resistor is necessary.

As a result, the chip area of the semiconductor device can be reduced even for the gate arrays. This increases the number of the semiconductor devices capable of fabrication from a single semiconductor wafer and accordingly, the fabrication yield increase can be realized.

In a preferred embodiment of the semiconductor device according to the first aspect, the second conductive region has a two layer structure made of a first sublayer and a second sublayer. The first sublayer is contacted with the semiconductor plug, and the second sublayer is not contacted with the semiconductor plug.

In another preferred embodiment of the semiconductor device according to the first aspect, the resistance of the second conductive region is equal to or less than (1/10) of the contact resistance of the semiconductor plug and the second conductive layer.

In still another preferred embodiment of the semiconductor device according to the first aspect, an active element is formed in, on, or over the semiconductor substrate. The conductive region serves as a part of the active element. The semiconductor plug is located to be overlapped with the active element.

According to a second aspect of the present invention, a fabrication method of the semiconductor device according to the first aspect is provided, which includes the following steps:

A step is to prepare a semiconductor substrate having a first conductive region.

A step is to form a dielectric layer to cover the first conductive region.

A step is to planarize a surface of the dielectric layer thus formed.

A step is to form a contact hole in the dielectric layer to vertically penetrate the dielectric layer. The first conductive region is exposed from the dielectric layer in the contact hole.

A step is to form a semiconductor plug to fill the contact hole with a material of the plug. The plug is doped with an impurity. The bottom of the plug is contacted with the first conductive region.

A step is to selectively form a second conductive region to cover the semiconductor plug. The second conductive region is contacted with the top of the semiconductor plug.

The semiconductor plug has a resistance. The interface of the semiconductor plug and the second conductive region has a contact resistance. The semiconductor plug and the second conductive region serve as a resistor having a resistance equal to the sum of the resistance of the semiconductor plug and the contact resistance.

With the fabrication method of the semiconductor device according to the second aspect of the invention, the semiconductor device according to the first aspect can be fabricated.

In a preferred embodiment of the method according to the second aspect, the step of planarizing the surface of the dielectric layer is performed by reflowing the dielectric layer, or polishing the surface of the dielectric layer.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below referring to the drawings attached.

FIRST EMBODIMENT

Figure 5:
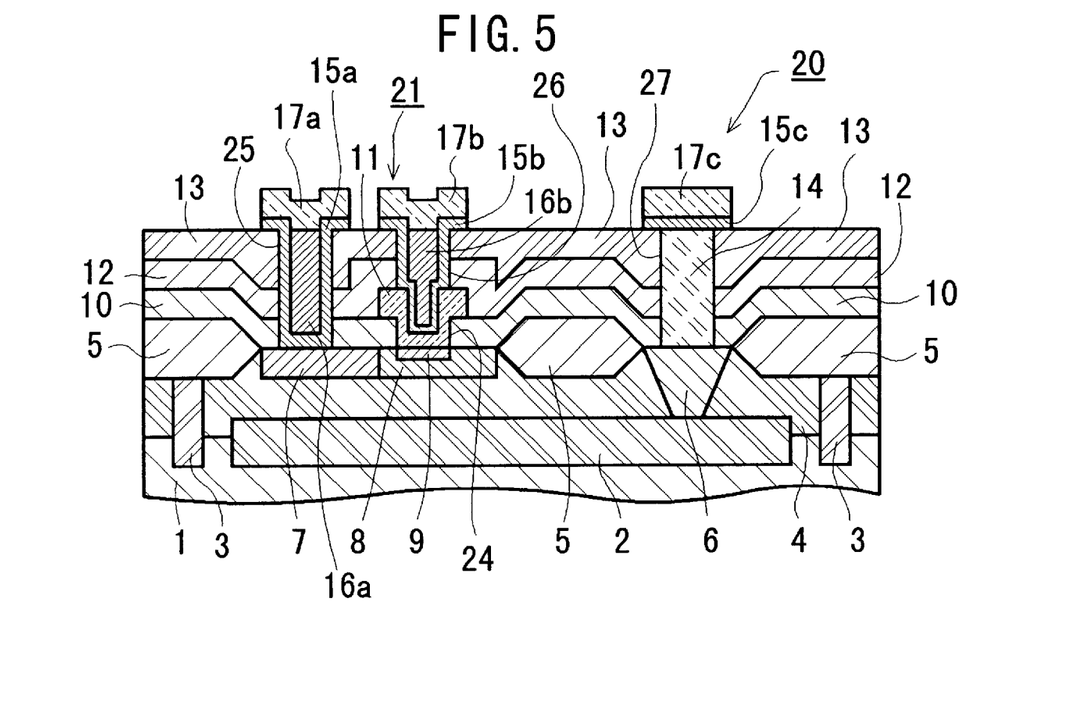
FIG. 5 is a cross-sectional view showing a semiconductor device according to an embodiment of the present invention, which has a bipolar transistor and a resistor.

As shown in FIG. 5, a semiconductor device according to a first embodiment of the invention includes an npn-type bipolar transistor 21 and a resistor 20.

It is needless to say that this semiconductor device has a plurality of bipolar transistors and a plurality of resistors. However, only one of the bipolar transistors and only one of the resistors are explained here for the sake of simplification.

Figure 6:
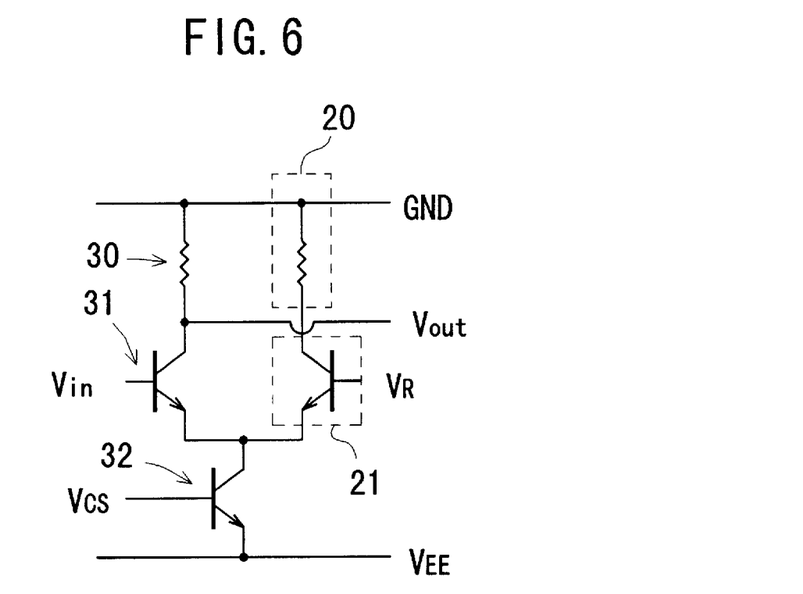
FIG. 6 is a circuit diagram of the semiconductor device according to the embodiment of the present invention.

The electrical connection of the transistor 21 and the resistor 20 are shown in FIG. 6, which constitute an Emitter-Coupled Logic (ECL) circuit. In FIG. 6, one terminal of the resistor 20 is connected to a collector of the transistor 21, the other terminal thereof is connected to the ground. A base of the transistor 21 is applied with a reference voltage $V_s$. An emitter of the transistor 21 is connected to an emitter of an npn-type bipolar transistor 31. A collector of the transistor 31 is connected to the ground through a resistor 30. A base of the transistor 31 is applied with an input voltage $V_{in}$.

A collector of an npn-type bipolar transistor 32 is connected to the coupled emitters of the transistors 21 and 31. An emitter is applied with a power supply voltage $V_{Er}$. A base of the transistor 32 is applied with a voltage $V_{cs}$.

An output voltage $V_{out}$ is derived from a collector of the transistor 31.

In FIG. 5, an n-type single-crystal Si epitaxial layer 4 is formed on the surface of a p-type single-crystal Si substrate 1. An n-type buried layer 2 is formed near the interface of the substrate 1 and the epitaxial layer 4. A p-type insulating layer 3 is selectively formed in the epitaxial layer 4. The bottom of the layer 3 is extended to the inside of the substrate 1.

A field oxide layer 5 of $SiO_2$ is selectively formed in the surface area of the epitaxial layer 4 for electrical isolation. The bipolar transistor 21 is electrically isolated from the other devices (not shown) adjacent to the transistor 21.

An $n^+$-type collector connection region 6, a p-type extrinsic base region 7, and a p-type intrinsic base region 8, and an n-type emitter region 9 are formed in the epitaxial layer 4. The part of the epitaxial layer 4 surrounded by the field oxide layer 5 serves as a collector region of the transistor 21.

A $SiO_2$ layer 10 is formed on the field oxide layer 5 and the exposed epitaxial layer 4. A contact window 24 is formed in the layer 10 to expose the underlying the emitter region 9.

An n-type polysilicon emitter contact region 11 is selectively formed on the $SiO_2$ layer 10 to be contacted with the n-type emitter region 9 through the window 24. The emitter contact region 11 is doped with arsenic (As) as an n-type impurity. The doped As serves as a diffusion source of the n-type impurity during the thermal diffusion process of forming the n-type emitter region 9.

A $SiO_2$ layer 12 and a BPSG layer 13 are successively formed on the $SiO_2$ layer 10 to cover the polysilicon emitter contact region 11. A contact hole 25 is formed to vertically penetrate the BPSG layer 13 and the $SiO_2$ layers 12 and 10. The contact hole 25 exposes the underlying extrinsic base region 7. A contact hole 26 is formed to vertically penetrate the BPSG layer 13 and the $SiO_2$ layer 12. The contact hole 26 exposes the underlying polysilicon emitter contact region 11. A contact hole 27 is formed to vertically penetrate the BPSG layer 113 and the $SiO_2$ layers 12 and 10. The contact hole 27 exposes the underlying collector connection region 6.

Barrier metal layers 15a and 15b are selectively formed in the contact holes 25 and 26 to cover the sides and bottoms of the holes 25 and 26, respectively. The layer 15a in the hole 25 is contacted with the extrinsic base region 7. The layer 15b in the hole 26 is contacted with the emitter contact region 11.

A polysilicon region 14 is formed in the contact hole 27. In other words, the contact hole 27 is filled with the polysilicon region 14. The region 14 is contacted with the collector connection region 6. No barrier metal layer is formed in the contact hole 27.

A barrier metal layer 15c is selectively formed on the BPSG layer 13 to be contacted with the top of the region 14.

Tungsten (W) layers 16a and 16b are selectively formed on the corresponding barrier metal layers 15a and 15b in the contact holes 25 and 26, respectively.

A conductive AlSiCu layer 17a is selectively formed on the W layers 16a and the barrier metal layer 15a. A conductive AlSiCu layer 17b is selectively formed on the W layer 16b and the barrier metal layer 15b. A conductive AlSiCu layer 17c is selectively formed on the barrier metal layer 15c. The AlSiCu layers 17a, 17b, and 17c are used for wiring or interconnection, respectively.

Figure 7A:
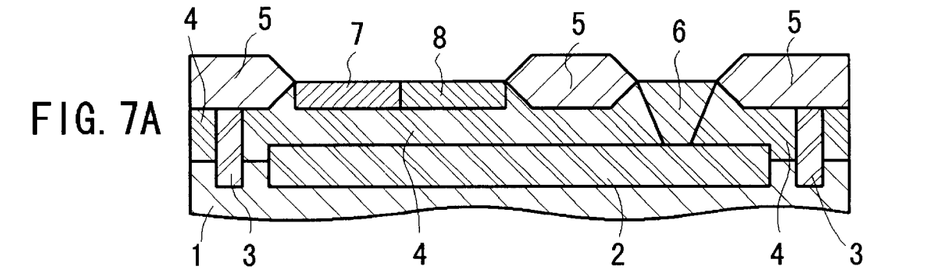
FIGS. 7A to 7D are cross-sectional views showing a fabrication method of the semiconductor device according to the embodiment of the present invention, respectively.

The semiconductor device according to the first embodiment of FIG. 5 is fabricated in the following way:

First, as shown in FIG. 7A, the n-type single-crystal Si epitaxial layer 4, the n-type buried layer 2, the p-type insulating layer 3, the field oxide layer 5, the $n^+$-type collector connection region 6, the p-type extrinsic base region 7, and the p-type intrinsic base region 8 are formed with the use of known process steps. The state at this stage is shown in FIG. 7A.

Figure 7B:
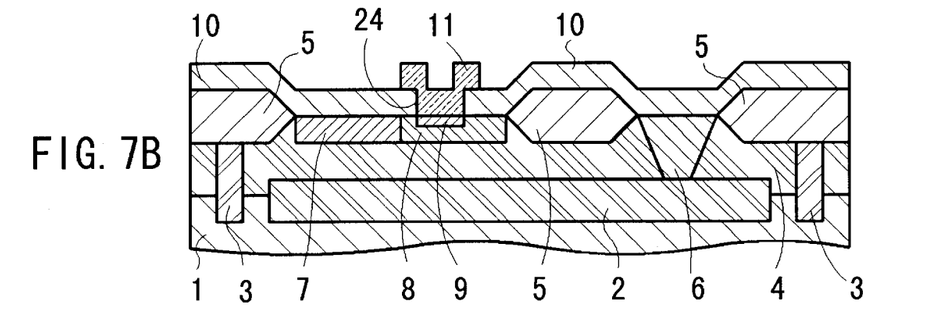

Then, as shown in FIG. 7B, the $SiO_2$ layer 10 with a thickness of 150 nm is formed on the field oxide layer 5 and the exposed epitaxial layer 4 by using a CVD process. The contact window 24 is formed in the $SiO_2$ layer 10 by using photolithography and dry etching processes, thereby exposing the underlying the intrinsic base region 8.

Subsequently, a polysilicon layer (not shown) with a thickness of approximately 200 nm is formed on the $SiO_2$ layer 10 by using a Low-Pressure CVD process. This polysilicon layer may be formed by a sputtering process. In this case, this layer becomes amorphous. This means that the polysilicon layer is replaced with an amorphous polysilicon layer.

A part of the polysilicon layer thus formed, which serves as the impurity source for the formation process of the n-type emitter region 9, is selectively doped with As by an ion-implantation process at an acceleration energy of 50 keV to 100 keV with a dose of $1 \times 10^{16}$ atoms/cm$^2$.

The polysilicon layer thus ion-implanted is then patterned by photolithography and dry etching processes, thereby forming the n-type polysilicon layer 11. The state at this stage is shown in FIG. 7B. The n-type polysilicon layer 11 is contacted with the emitter region 9 through the window 24.

Following this patterning process, the $SiO_2$ layer 12 with thickness of approximately 100 nm and the BPSG layer 13 with a thickness of approximately 1000 nm are successively formed on the $SiO_2$ layer 10 to cover the n-type polysilicon layer 11.

Figure 7C:
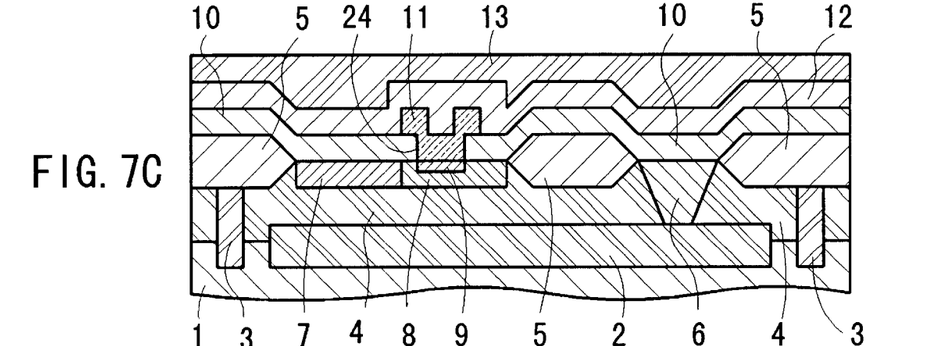

The assembly thus formed is subjected to a heat treatment at a temperature of 900 to 950° C. for approximately 20 minutes. Through this heat-treatment process, the implanted As atoms are diffused into the intrinsic base region 8, resulting in the n-type emitter region 9. At the same time as this diffusion process, the BPSG layer 13 is reflown, resulting in the planarized surface of the layer 13. The state at this stage is shown in FIG. 3c.

Further, the BPSG layer 13 thus reflown and the underlying $SiO_2$ layers 12 and 10 are patterned by photolithography and dry etching processes, thereby forming the contact hole 27. Through the similar ways, the contact hole 27 is formed in the BPSG layer 13 and the $SiO_2$ layers 12 and 10 at the location right over the collector connection region 6.

Figure 7D:
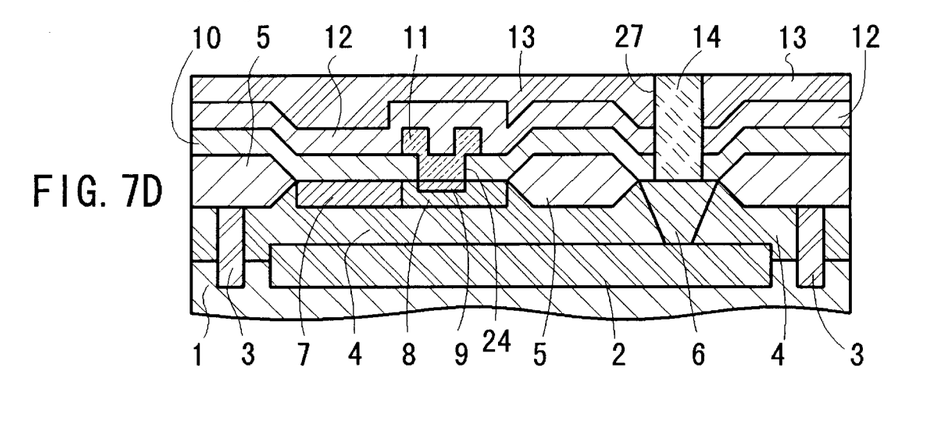

A polysilicon layer (not shown) with a thickness of approximately 800 to 1200 nm is formed on the BPSG layer 13 by using a Low-Pressure CVD process while doping As into the polysilicon layer. The doping concentration of As of the n-type polysilicon layer is $2.81 \times 10^{19}$ atoms/cm$^3$. The n-type polysilicon layer is then etched back, selectively removing the polysilicon layer without affecting the polysilicon in the contact hole 27. Thus, the contact hole 27 is filled with the n-type polysilicon, thereby forming the polysilicon plug 14. The state at this stage is shown in FIG. 7D.

Following this, as shown in FIG. 5, using photolithography and dry etching processes, the BPSG layer 13 and the $SiO_2$ layers 12 and 10 are patterned to form the contact hole 25 located over the extrinsic base region 7, and the BPSG layer 13 and the $SiO_2$ layer 12 are patterned to form the contact hole 26 located over the intrinsic base region 8.

A metal layer (not shown) serving as the barrier metal layers 15a, 15b, and 15c is deposited by a CVD process. This metal layer has a two-layer structure made of a lower titanium (Ti) sublayer with a thickness of 5 nm and an upper titanium nitride (TiN) sublayer with a thickness of 100 nm.

A W layer (not shown) with a thickness of 1000 nm is deposited on the metal layer by a CVD process. Then, the metal layer and the W layer are etched back to selectively remove these layers, thereby leaving the barrier metal layers 15a, 15b, and 15c in the corresponding contact holes 25, 26, and 27, respectively.

An AlSiCu layer (not shown) with a thickness of 800 nm is deposited by a CVD process and then, is patterned by photolithography and dry etching processes. Thus, the wiring AlSiCu layers 17a, 17b and 17c are selectively formed on the corresponding W layers 16, respectively.

Finally, the semiconductor assembly thus obtained is subjected to a heat treatment for an annealing purpose at a temperature of 430° C. for approximately 30 minutes. Thus, the semiconductor according to the first embodiment shown in FIG. 5 is finished.

With the semiconductor device according to the embodiment of the invention, the contact hole 27 vertically penetrating the layers 13, 12, and 10 is filled with the n-type polysilicon plug 14. Also, the bottom of the plug 14 is contacted with the collector connection region 6 and the top of the plug 14 is contacted with the barrier layer 15c. Therefore, the collector connection region 6, and the barrier and layer 15c and AlSiCu layer 17c layers 15c and 17c are overlapped with each other. Thus, the region 6 and the barrier metal layer 15c are electrically connected to each other through the semiconductor plug 14.

Further, the semiconductor plug 14 and the barrier metal layer 15c serve as the resistor having the resistance equal to the sum of the resistance of the semiconductor plug 14 and the contact resistance. The plug 14 has a resistance equal to or less than (1/10)th the contact resistance of plug with the barrier metal layer 15C.

Accordingly, the area of the resistor is substantially defined by the plan size of the plug 14. This means that the area of the resistor can be reduced.

Also, since the collector connection region 6 and the barrier and layer 15c and AlSiCu layer 17c are overlapped with each other. Thus, the semiconductor plug 14 can be laid right over the active element. This means that no space dedicated to a resistor is necessary.

As a result, the chip are of the semiconductor device can be reduced even for the gate arrays. This increases the number of the semiconductor devices capable of fabrication from a single semiconductor wafer and accordingly, the fabrication yield increase can be realized.

In the semiconductor device according to the invention, as shown in FIG. 5, it is supposed that the resistor needs to have a resistance of 2.0 kΩ. The contact hole 27 has a width W of 0.8 μm, a length L of 2.0 μm, and a depth of 1.25 μm. Therefore, the contact area is of 1.6 μm$^2$ (=0.8 μm×2.0 μm).

The contact resistance $R_o$ is inversely proportions to the sum of (W+L), because a current tends to flow through the periphery of the contact area, and the current tends not to flow through the central area.

Figure 8:
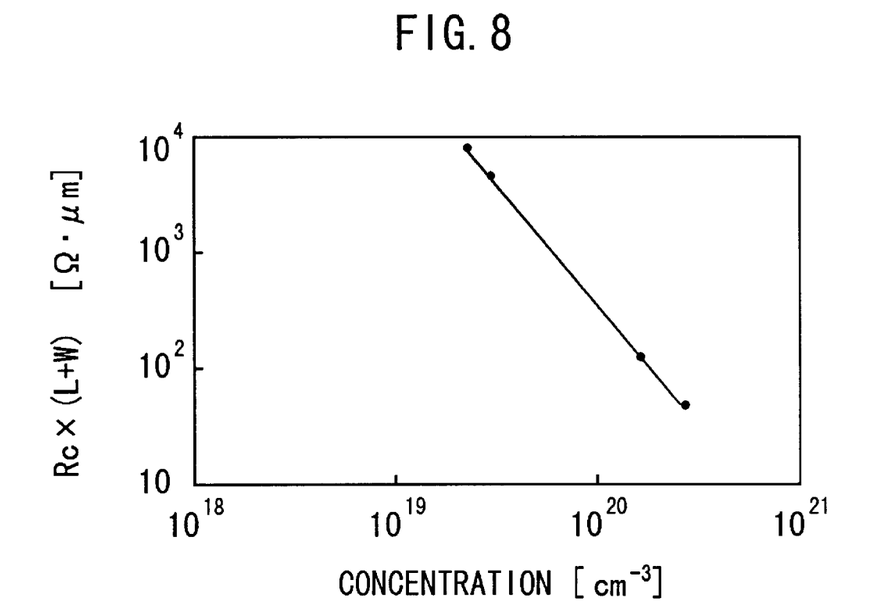
FIG. 8 is a graph showing the relationship of the contact resistance with the impurity concentration in the semiconductor device according to the embodiment of the present invention.

FIG. 8 shows the relationship of the contact resistance with the impurity concentration in the semiconductor device according to the first embodiment. If a resistor whose resistance R is 2 kΩ is designed, the following expression is given by the following equation (4).

$$L = R_c \times (W+L) = 5.6 \text{ k}\Omega \cdot \mu m \tag{4}$$

Figure 9:
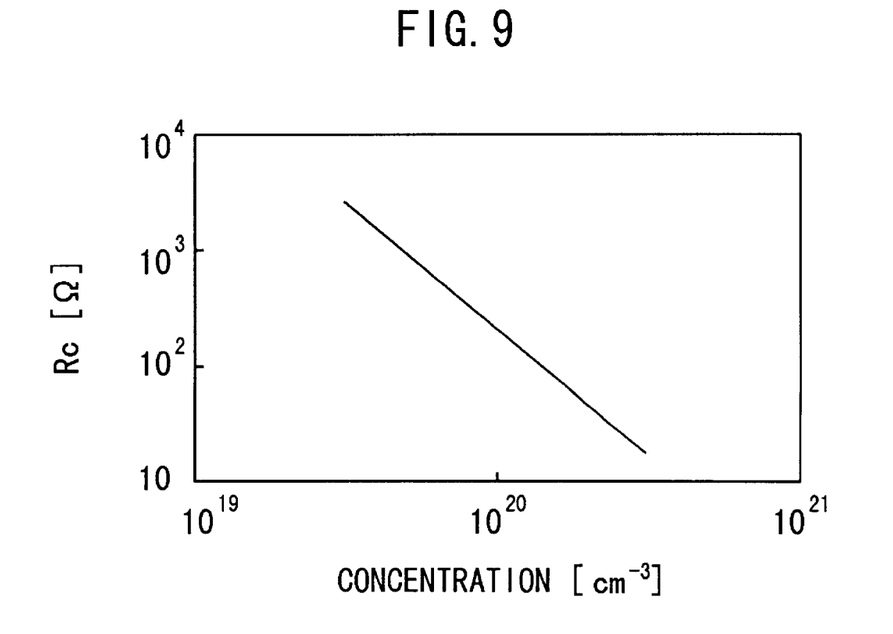
FIG. 9 is a graph showing the relationship of the contact resistance with the impurity concentration in the semiconductor device according to the embodiment of the present invention.

It is seen from FIG. 9 that the doping concentration of the polysilicon plug 14 should be set as $2.81 \times 10^{19}$ atoms/cm$^3$.

Figure 10:
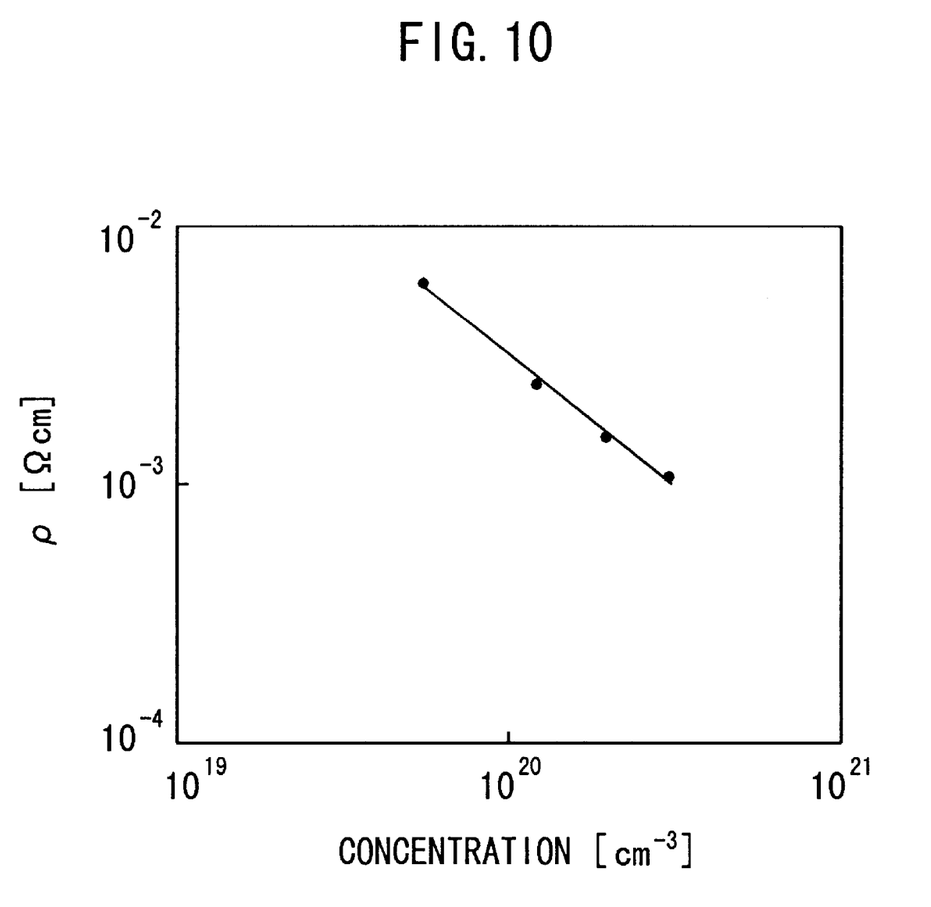
FIG. 10 is a graph showing the relationship of the resistivity with the impurity concentration in the semiconductor device according to the embodiment of the present invention.

On the other hand, the resistivity of the resistor 20 is given as $1.83 \times 10^{-2}$ Ω·cm. Therefore, the resistance $R_t$ of the resistor 20 is expressed by the following equation (5).

$$R_t = \rho\{T/(W \times L)\} = 143.13 \text{ }\Omega \tag{4}$$

where $R_t$ is the resistance of the resistor 20, T is the contact depth, and ρ is the resistivity of the resistor 20.

The total resistance R is expressed by the sum of $R_c$ and $R_t$.

$$R = R_c + R_t = 2.14 \text{ k}\Omega \tag{5}$$

The resistance of the resistor itself can be ignored. Therefore, if the size (i.e., W and L) of the contact area and the doping concentration of the resistor controlled or monitored, the wanted or predesigned resistance value is obtained independent of the fluctuation of the contact depth (T). Accordingly, the resistance may be formed on the emitter region 9.

The fluctuation of the thickness of various dielectric layers and the fluctuation of the reflow process do not affect the contact depth (D).

SECOND EMBODIMENT

A semiconductor device according to a second embodiment has the same configuration as that of the first embodiment.

Figure 11A:
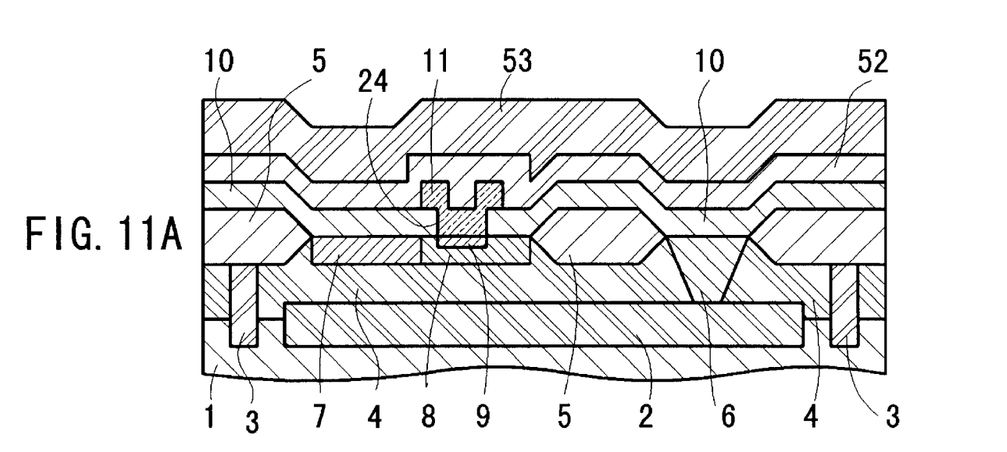
FIGS. 11A and 11B are cross-sectional views showing a fabrication method of the semiconductor device according to a second embodiment of the present invention, respectively.
Figure 11B:
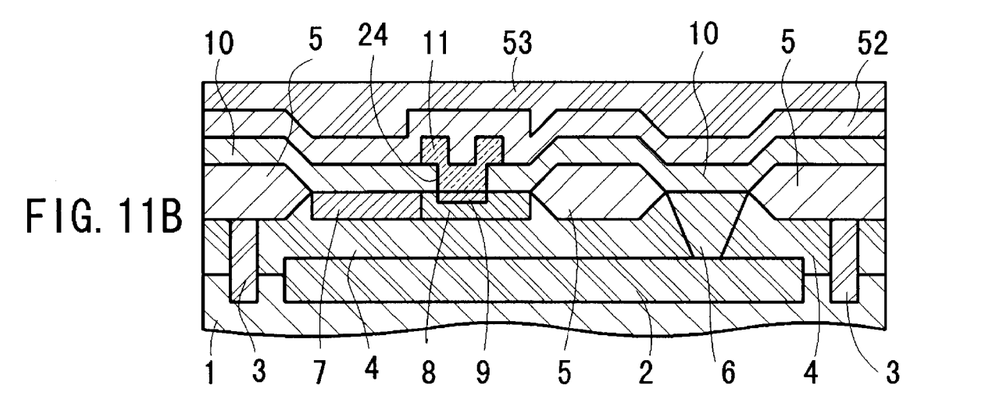

FIGS. 11A and 11B show part of a step sequence of a fabrication method according to the second aspect.

For the ECL gate arrays requesting high-speed operation, to reduce the junction capacitance, the depth of the base-to-emitter junction should be as shallow as possible. Therefore, the heat treatment process after the emitter formation process needs to be restrained.

With the method according to the first aspect, the treatment temperature needs to be 900° C. due to the reflowing process. The reason is that the planarization of the BPSG layer is insufficient and as a result, etching residue tends to be left during the etching back process of the polysilicon layer, and the etched back process of the polysilicon layer, resulting in short circuit.

In the method according to the third embodiment, the reflow process is carried out at a temperature of 800° C. Then, Chemical-Mechanical polishing (CMP) process is then performed to planarize the surface of the BPSG layer 53. The other processes are the same as those of the first embodiment.

In the above first and second embodiments, a bipolar transistor is used as an active component. However, it is needless to say that any other active component such as a Field-Effect Transistors (FET) may be used in the present invention.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:
  (a) a semiconductor substrate having a conductive region;
  (b) an insulating layer formed to cover said conductive region;
    said insulating layer having a contact hole formed to penetrate said insulating layer;
    said conductive region being exposed from said insulating layer in said contact hole;
  (c) a semiconductor plug formed in said contact hole to bury said contact hole;
    said plug being doped with an impurity;
    the bottom of said plug being contacted with said conductive region;
  (d) a conductive barrier layer selectively formed to cover the top of said plug;
    said barrier layer being contacted with the top of said plug;
  (e) a conductive wiring layer selectively formed on and contacted with said barrier layer;
  wherein said semiconductor plug serves as a resistor; and
  wherein said plug has a resistance equal to or less than ($\frac{1}{10}$) of a contact resistance of said plug with said barrier layer.

2. A semiconductor device as claimed in claim 1, further comprising an active element formed in, or, over said substrate;
  wherein said conductive region serves as a part of said active element;
  and wherein said plug is located to be overlapped with said active element.

3. A semiconductor device comprising:
  (a) a semiconductor substrate having an active element;
    said active element including a first conductive region and a second conductive region;
  (b) an insulating layer formed to cover said active element;
    said insulating layer having first and second contact holes formed to penetrate said insulating layer;
    said first conductive region of said active element being exposed from said insulating layer through said first contact hole;
    said second conductive region of said active element being exposed from said insulating layer through said second contact hole;
  (c) a semiconductor plug formed in said first contact hole to bury said first contact hole;
    said plug being doped with an impurity;
    the bottom of said plug being contacted with said first conductive region;
  (d) a first conductive barrier layer formed to cover the top of said plug;
    said first barrier layer having a function of preventing said impurity doped into said plug from diffusing;
    said first barrier layer being contacted with the top of said plug;
  (e) a first conductive wiring layer formed on said first barrier layer;
    said first wiring layer being contacted with said first barrier layer;
  (f) a metal formed in said second contact hole;
  (g) a second conductive barrier layer formed on at least part of said metal;
  (h) a second conductive wiring layer formed on said second said barrier layer;
    said second wiring layer being contacted with said second barrier layer;
  wherein said semiconductor plug serves as a resistor; and
  wherein said semiconductor plug has a resistance equal to or less than ($\frac{1}{10}$) of a contact resistance of said plug with said barrier layer.

4. A semiconductor device as claimed in claim 3, wherein said active element is a bipolar transistor;
  and wherein said first conductive region of said active element is a collector connection region;
  and wherein said second conductive region of said active element is an emitter or base contact region.

5. A semiconductor device as claimed in claim 3 wherein:
  said metal is refractory metal layer which covers the bottom and side walls of said second contact hole and which contacts said second conductive region;
  said device further comprising:
    a second plug formed of a conductor and formed in said second contact hole within said refractory metal layer;
  wherein said second barrier layer prevents an impurity doped into said second plug from diffusing.

6. A semiconductor device having a transistor and a resistor formed on a single substrate, comprising:
  an active element formed on a surface of said substrate;
  an insulating layer formed to cover said active element and having a contact hole formed to penetrate said insulating layer;

an annealed conductive element including a semiconductor plug formed in said contact hole and a barrier layer formed to cover the plug, wherein said plug is doped with impurities and the barrier layer is formed, before the conductive element is annealed; and a wiring layer formed on said conductive element;

wherein said semiconductor plug serves as a resistor; and wherein said semiconductor plug has a resistance equal to or less than one-tenth of a contact resistance of said plug with said barrier layer.

* * * * *